United States Patent
Chu

(10) Patent No.: US 11,978,504 B2
(45) Date of Patent: May 7, 2024

(54) METHOD AND APPARATUS FOR DETERMINING SENSE BOUNDARY OF SENSE AMPLIFIER, MEDIUM, AND DEVICE

(71) Applicant: CHANGXIN MEMORY TECHNOLOGIES, INC., Hefei (CN)

(72) Inventor: Xikun Chu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 126 days.

(21) Appl. No.: 17/807,119

(22) Filed: Jun. 15, 2022

(65) Prior Publication Data

US 2023/0307034 A1  Sep. 28, 2023

Related U.S. Application Data

(63) Continuation of application No. PCT/CN2022/096275, filed on May 31, 2022.

(30) Foreign Application Priority Data

Mar. 23, 2022  (CN) .......................... 202210293485.2

(51) Int. Cl.
G11C 11/40 (2006.01)
G11C 11/4091 (2006.01)

(52) U.S. Cl.
CPC ............................... *G11C 11/4091* (2013.01)

(58) Field of Classification Search
CPC .............. G11C 11/4091; G11C 11/408; G11C 2207/2254; G11C 7/08; G11C 11/4094
See application file for complete search history.

(56) References Cited

U.S. PATENT DOCUMENTS 5,235,699 A * 8/1993 Shaffer ............... G11C 11/4076
713/502
6,023,434 A    2/2000 Shore et al.
6,041,002 A    3/2000 Maejima
(Continued)

FOREIGN PATENT DOCUMENTS

CN  101162606 A  4/2008
CN  107039084 B  4/2020
(Continued)

OTHER PUBLICATIONS

International Search Report and written opinion in Application No. PCT/CN2022/096275, dated Dec. 5, 2022.
(Continued)

*Primary Examiner* — Xiaochun L Chen
(74) *Attorney, Agent, or Firm* — Syncoda LLC; Feng Ma

(57) ABSTRACT

A method for determining a sense boundary of a sense amplifier includes: writing the same data into the memory cells controlled by at least a pair of first word line on the left side and second word line on the right side corresponding to the sense amplifier; activating the first word line and precharging bit lines corresponding to the first word line; reading the data in the memory cells controlled by the corresponding second word line after a preset row precharge time; and determining a corresponding critical row precharge time as a row precharge time boundary value when the sense amplifier does not correctly read the data in the memory cells controlled by the second word line.

18 Claims, 8 Drawing Sheets

(56) References Cited

U.S. PATENT DOCUMENTS

| | | | |
|---|---|---|---|
| 6,219,294 B1* | 4/2001 | Huber | G11C 5/143 |
| | | | 365/205 |
| 6,636,998 B1 | 10/2003 | Lee et al. | |
| 7,478,294 B2 | 1/2009 | Rong et al. | |
| 7,633,818 B2 | 12/2009 | Tomita | |
| 8,397,129 B2 | 3/2013 | Schreck et al. | |
| 9,281,075 B2 | 3/2016 | Ryu et al. | |
| 10,854,275 B2 | 12/2020 | Son | |
| 2002/0051401 A1 | 5/2002 | Lee | |
| 2002/0080677 A1 | 6/2002 | Watanabe et al. | |
| 2006/0083070 A1 | 4/2006 | Arakawa | |
| 2006/0133166 A1 | 6/2006 | Kikutake et al. | |
| 2007/0159900 A1 | 7/2007 | Aoki | |
| 2008/0019199 A1 | 1/2008 | Uchikoba et al. | |
| 2010/0302866 A1 | 12/2010 | Cha et al. | |
| 2011/0121294 A1 | 5/2011 | Koyama et al. | |
| 2019/0066770 A1 | 2/2019 | Sisodia et al. | |
| 2020/0176053 A1 | 6/2020 | Lin et al. | |
| 2020/0388309 A1 | 12/2020 | Gupta et al. | |
| 2022/0308788 A1 | 9/2022 | Zhao et al. | |
| 2022/0319577 A1 | 10/2022 | Chen et al. | |
| 2023/0008272 A1 | 1/2023 | Rana et al. | |

FOREIGN PATENT DOCUMENTS

| | | |
|---|---|---|
| CN | 112099734 A | 12/2020 |
| CN | 112216339 A | 1/2021 |
| CN | 112885401 A | 6/2021 |
| CN | 113035259 A | 6/2021 |
| CN | 114187956 A | 3/2022 |

OTHER PUBLICATIONS

International Search Report and written opinion in Application No. PCT/CN2022/089105, dated Dec. 16, 2022.
International Search Report and written opinion in Application No. PCT/CN2022/096257, dated Dec. 19, 2022.
U.S. non-final office action in U.S. Appl. No. 17/846,009, dated Apr. 18, 2023.
U.S. non-final office action in U.S. Appl. No. 17/807,760, dated Mar. 15, 2023.
U.S. office action in U.S. Appl. No. 17/846,009, dated Jul. 31, 2023.
U.S. office action in U.S. Appl. No. 17/846,009, dated Aug. 28, 2023.

* cited by examiner

METHOD AND APPARATUS FOR DETERMINING SENSE BOUNDARY OF SENSE AMPLIFIER, MEDIUM, AND DEVICE

CROSS-REFERENCE TO RELATED APPLICATIONS

This is a continuation of International Application No. PCT/CN2022/096275 filed on May 31, 2022, which claims priority to Chinese Patent Application No. 202210293485.2 filed on Mar. 23, 2022. The disclosures of these applications are hereby incorporated by reference in their entirety.

BACKGROUND

Dynamic random access memory (DRAM) is a commonly-used semiconductor memory device in computers. Due to such advantages as simple structure, high density, low power consumption, and low price, the DRAM has been widely used in the computer field and electronic industry.

For the DRAM, in the reading and writing stage, it is often necessary to amplify tiny voltage change on a bit line through a sense amplifier and convert the same into a digital signal to facilitate the reading of data.

However, some sense amplifiers are prone to generating sense errors at a sense boundary, resulting in errors in read data. Therefore, determining the sense boundary of the sense amplifier is of great significance for evaluating the amplification performance of the sense amplifier.

SUMMARY

The present disclosure relates to, but is not limited to, a method for determining a sense boundary of a sense amplifier, an apparatus for determining a sense boundary of a sense amplifier, a computer-readable storage medium, and an electronic device.

An overview of the subject matter detailed in the present disclosure is provided below, which is not intended to limit the protection scope of the claims.

The present disclosure provides a method for determining a sense boundary of a sense amplifier, an apparatus for determining a sense boundary of a sense amplifier, a computer-readable storage medium, and an electronic device.

According to a first aspect of the present disclosure, a method for determining a sense boundary of a sense amplifier is provided. The method includes: writing a same data into the memory cells controlled by at least a pair of first word line on the left side and second word line on the right side corresponding to the sense amplifier; activating the first word line and precharging the bit lines to the first word line; reading the data in the memory cells controlled by the corresponding second word line after a preset row precharge time; and determining a corresponding critical row precharge time as a row precharge time boundary value when the sense amplifier does not correctly read the data in the memory cells controlled by the second word line.

According to a second aspect of the present disclosure, an apparatus for determining a sense boundary of a sense amplifier is provided. The apparatus includes: one or more processors; and a storage apparatus, configured to store one or more programs, wherein the one or more programs, when executed by the one or more processors, cause the one or more processors to execute operations of: writing a same data into the memory cells controlled by at least a pair of first word line on the left side and second word line on the right side corresponding to the sense amplifier; activating the first word line and precharging the bit lines corresponding to the first word line; reading the data in the memory cells controlled by the second word line after a preset row precharge time; and determining a corresponding critical row precharge time as a row precharge time boundary value when the sense amplifier does not correctly read the data in the memory cells controlled by the second word line.

According to a third aspect of the present disclosure, a computer-readable storage medium is provided, on which a computer program is stored. The computer program is executed by a processor to implement the method for determining a sense boundary of a sense amplifier according to the first aspect.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may derive other accompanying drawings based on these accompanying drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

A semiconductor memory is used in computers, servers, handheld devices such as mobile phones, printers, and many other electronic devices and applications. The semiconductor memory includes a plurality of memory cells in a memory array, and each memory cell stores at least one bit of information. A dynamic random access memory (DRAM) is an example of such a semiconductor memory. This solution is preferably used in the DRAM. Therefore, the descriptions of embodiments below are made with reference to the DRAM as a non-limiting example.

In a DRAM integrated circuit device, memory cells in an array are typically arranged in rows and columns, such that a particular memory cell may be addressed by specifying a row and a column of its array. A word line connects the rows to a group of bit line sense amplifiers (SAs) that detect data in the cells. A data subset in the SAs is then selected or "column-selected" for output in a read operation.

Figure 1:
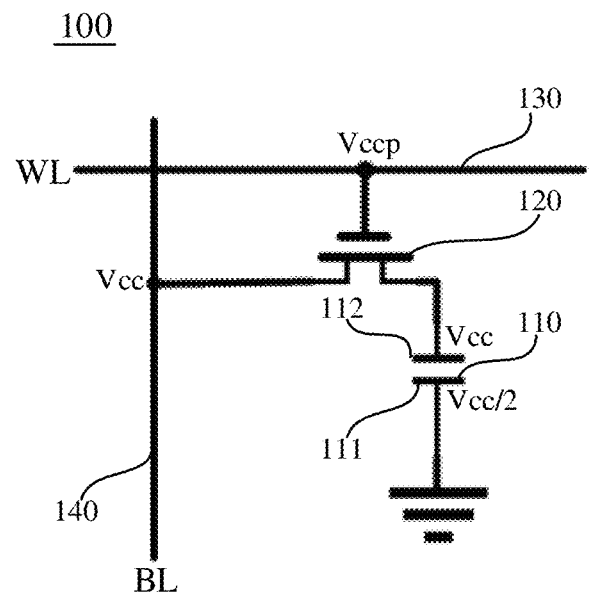
FIG. 1 schematically illustrates a schematic structural diagram of a memory cell according to an exemplary embodiment of the present disclosure.

Referring to FIG. 1, each memory cell 100 in the DRAM typically includes a capacitor 110, a transistor, 120, a word line (WL) 130, and a bit line (BL) 140. The transistor 120 is provided with a gate connected to the word line 130, a drain connected to the bit line 140, and a source connected to the capacitor 110. A voltage signal on the word line 130 can control the transistor 120 to be turned on or off, and then data information stored in the capacitor 110 is read through the bit line 140, or data information is written into the capacitor 110 through the bit line 140 for storage. The memory array includes the above multiple memory cells. The memory array generally occupies 50-65% of the area of the entire DRAM device, and the rest area of the DRAM device is mainly occupied by a peripheral circuit.

Figure 2:
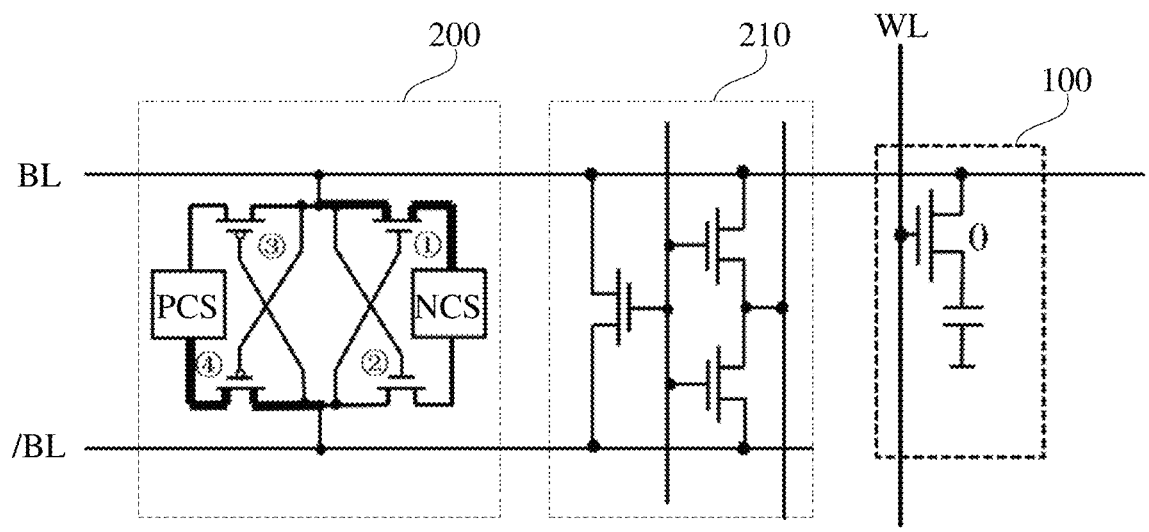
FIG. 2 schematically illustrates a schematic structural diagram of a connection relationship between a sense amplifier and a memory cell according to an exemplary embodiment of the present disclosure.

In the process of reading the data stored in the memory cell 100, it is necessary to amplify tiny voltage change on the bit line through the sense amplifier and convert same into a digital signal. Referring to FIG. 2, which illustrates a schematic structural diagram of a connection relationship between a sense amplifier and a memory cell. A bit line BL, a complementary bit line /BL, a word line WL, a sense amplifier 200, and a memory cell 100 are included. The memory cell 100 is provided with a gate connected to the word line WL and a drain connected to the bit line BL. The sense amplifier 200 operates with the bit line BL and the complementary bit line /BL serving as a reference line to detect and amplify a voltage difference on a pair of bit lines BL and /BL.

In the exemplary implementation of the present disclosure, a bit line equilibrium module 210 is also provided between the bit lines BL and the complementary bit line /BL, where the bit line balance module 210 is configured to pinch the bit line BL and the complementary bit line /BL under the action of a bit line equilibrium control signal BLEQ, so as to turn off the read and write operations to the memory cell 100.

Figure 3:
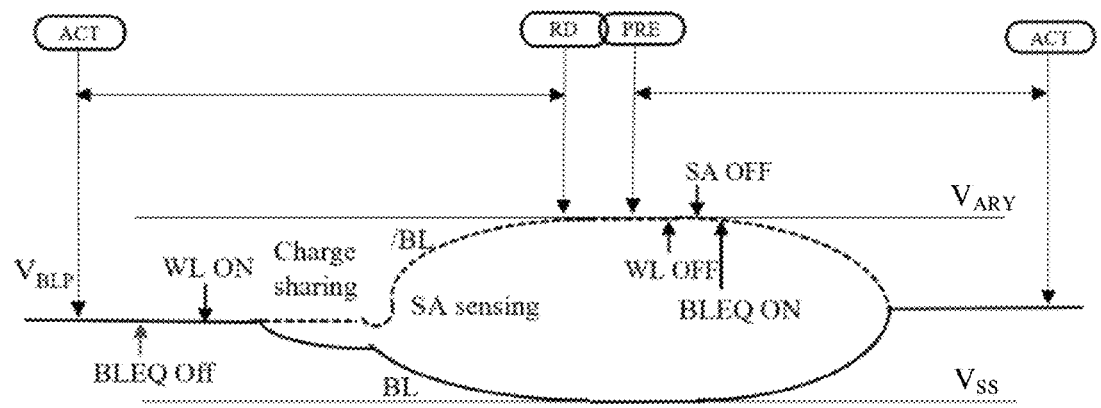
FIG. 3 schematically illustrates a schematic diagram of potential change of a sense amplifier when normally reading data 0 according to an exemplary embodiment of the present disclosure.

The process of amplifying the data stored in the memory cell 100 by the sense amplifier 200 will be described in detail below. Referring to FIG. 3, upon the reception of an activation signal ACT, a VBLP voltage is provided, such that the bit line equilibrium control signal BLEQ is turned off (i.e., BLEQ Off), and the pinched bit line BL and the complementary bit line /BL are separated. Then, the word line WL is turned on (i.e., WL ON), the transistor connected to the word line WL is turned on, and the voltage on the capacitor connected to the transistor is released onto the bit line BL through charge sharing, and the capacitor may store data 1 or data 0.

By taking the data 0 stored in the capacitor as an example, the stored 0 is shared from the bit line BL to the capacitor terminal, resulting in a negative voltage difference $\Delta V$, such that the voltage on the bit line BL becomes VBLP-$\Delta V$. At this time, the voltage on the complementary bit line /BL is still VBLP.

In FIG. 2, the sense amplifier 200 includes a first transistor (1), a second transistor (2), a third transistor (3), and a fourth transistor (4), where both the first transistor (1) and the second transistor (2) are negative channel metal oxide semiconductor (NMOS) transistors, and both the third transistor (3) and the fourth transistor (4) are positive channel metal oxide semiconductor (PMOS) transistors.

Referring to FIG. 3, which illustrates a schematic diagram of the process of the sense amplifier reading the data 0. When the voltage on the bit line BL is VBLP-$\Delta V$, and the voltage on the complementary bit line /BL is VBLP, the first transistor (1) and the second transistor (2) are turned on. Since the degree of turning on the first transistor (1) is greater than the degree of turning on the second transistor (2), the potential on the bit line BL is quickly pulled down to a voltage VSS at a node NCS. Moreover, in the process of pulling down the voltage on the bit line BL, the second transistor (2) is turned off, the fourth transistor (4) is turned on, and a voltage VARY at a node PCS is applied to the complementary bit line /BL, such that the potential on the complementary bit line /BL is pulled up to the VARY. At this time, the normal operation of data read (RD) can be performed. After the data read is completed, the word line can be turned off (i.e., WL OFF), the sense amplifier is also turned off (i.e., SA OFF) at this time, and the bit line equilibrium control signal (i.e., BLEQ ON) is turned on, thereby completing the read process of the memory cell 100.

It should be noted that, before a next activation signal ACT arrives, there will be a precharge (PRE) process, and the time consumed in this process is RAS row precharge time tRP. The size of the row precharge time tRP determines the potential level of the bit line BL and the complementary bit line /BL. If the row precharge time tRP is less, there is a possibility that the bit line BL and the complementary bit line /BL do not return to the same potential.

Figure 4:
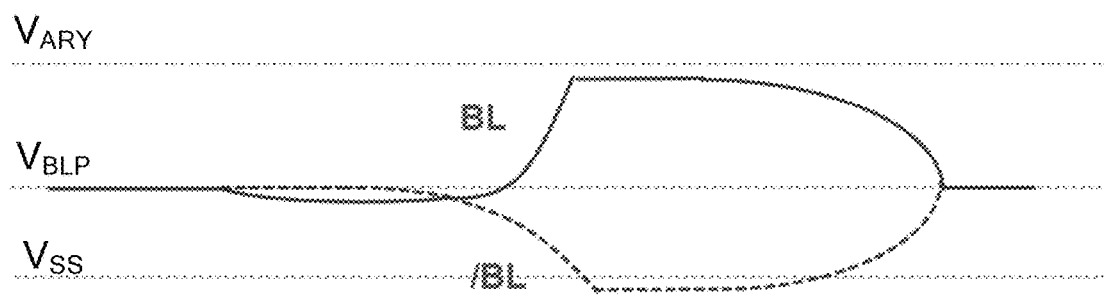
FIG. 4 schematically illustrates a schematic diagram of potential change of a sense amplifier when abnormally reading data 0 according to an exemplary embodiment of the present disclosure.

The process of sense amplifier sensing (SA sensing) shown in FIG. 3 belongs to the process of the sense amplifier normally sensing signal 0. Referring to FIG. 4, which illustrates a schematic diagram of a potential change when the sense amplifier abnormally sensing signal 0. In FIG. 4, when the sense amplifier senses the signal 0, the potential of the bit line BL is pulled up to the voltage VARY, resulting in the read signal being 1 instead of the really stored signal 0, which causes a read error. That is to say, according to whether the read data is correct or not, it can be determined whether the sense amplifier fails to sense 0.

By comparing FIG. 3 and FIG. 4, it can be seen that when the sense amplifier normally senses the signal 0, the potential on the bit line BL is always lower than the potential on the complementary bit line /BL. However, when the sense amplifier abnormally senses the signal 0, a situation where the potential on the bit line BL is higher than the potential on the complementary bit line /BL occurs. On this basis, the exemplary embodiments of the present disclosure provide a control to change the size of the row precharge time tRP (i.e., card tRP) to generate a situation where the potential on the bit line BL is higher than the potential on the complementary bit line /BL, such that the sense boundary of the sense amplifier can be determined, and the sense capability of the sense amplifier can be compared and analyzed.

In the process of controlling to change the size of the row precharge time tRP, as the row precharge time tRP becomes less and less, the potential on the bit line BL will gradually be higher than the potential on the complementary bit line /BL. When the potential on the bit line BL is higher than the potential on the complementary bit line /BL and reaches one critical value, the above situation where 0 is sensed unsuccessfully will occur. At this time, the corresponding row precharge time tRP can be used as the sense boundary of the sense amplifier for measuring the sense capability of the sense amplifier.

Figure 5:
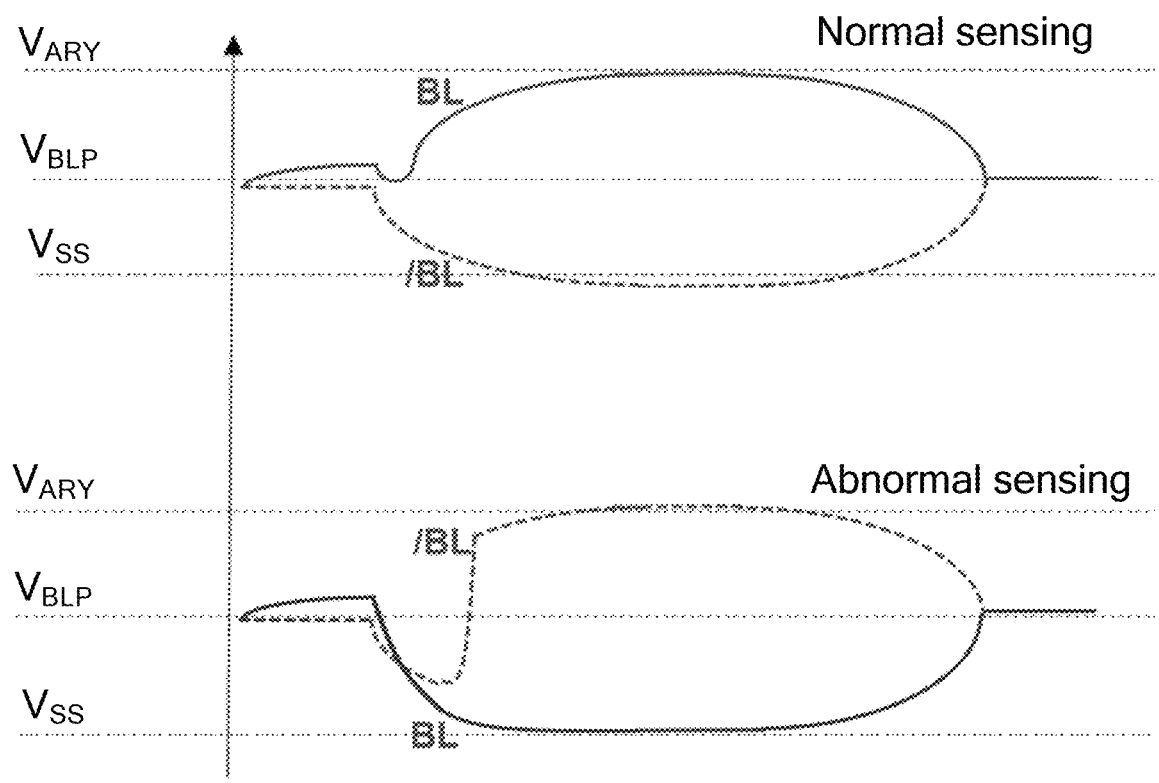
FIG. 5 schematically illustrates a schematic diagram of potential change comparison of a sense amplifier when reading data 1 according to an exemplary embodiment of the present disclosure.

Corresponding to the situation where 0 is sensed unsuccessfully, there is still a situation where 1 is sensed unsuccessfully. Referring to FIG. 5, when the sense amplifier normally senses the signal 1, the potential on the bit line BL is always higher than the potential on the complementary bit line /BL. However, when the sense amplifier abnormally senses the signal 1, a situation where the potential on the bit line BL is lower than the potential on the complementary bit line /BL occurs. Similarly, a control is provided to change the size of the row precharge time tRP to generate a situation where the potential on the bit line BL is lower than the potential on the complementary bit line /BL, such that the situation of wrong sensing occurs, the sense boundary of the sense amplifier can be determined, and the sense capability of the sense amplifier can be compared and analyzed.

Figure 6:
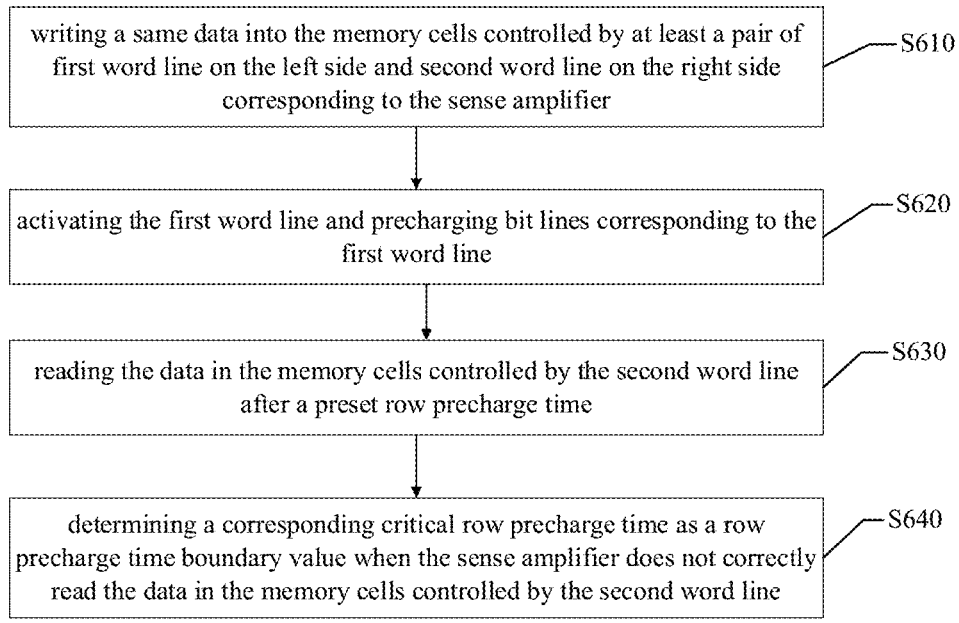
FIG. 6 schematically illustrates a flow diagram of a method for determining a sense boundary of a sense amplifier according to an exemplary embodiment of the present disclosure.

Referring to FIG. 6, the method for determining a sense boundary of a sense amplifier provided by the exemplary embodiments of the present disclosure may include:

Step S610, write the same data into the memory cells controlled by at least a pair of first word line on the left side and second word line on the right side corresponding to the sense amplifier;

Step S620, activate the first word line and precharge the bit lines corresponding to the first word line;

Step S630, read the data in the memory cells controlled by the second word line after a preset row precharge time; and Step S640, determine a corresponding critical row precharge time as a row precharge time boundary value when the sense amplifier does not correctly read the data in the second word line.

In the method for determining a sense boundary of a sense amplifier provided by the exemplary implementation of the present disclosure, the same data is written into the memory cells controlled by a pair of first word line on the left side and second word line on the right side corresponding to the sense amplifier, when the memory cells controlled by the second word line is read after the first word line is activated and the bit lines corresponding to the first word line are precharged, the sense amplifier needs to be crossed by the bit line, and in the process of the bit line crossing the sense amplifier, a potential of a complementary bit line /BL on the second word line will be reversed due to an interlocking effect between a bit line BL and the complementary bit line /BL, such that the potential of the complementary bit line /BL on the second word line will be deviated from an equilibrium value, and wrong reading will occur when the data in the second word line is read. By presetting the row precharge time, the situation of wrong reading can be quantified, such that the situation where the data is not correctly read can be determined as the critical row precharge time, which is used as the row precharge time boundary value for determining and measuring the sense boundary of the sense amplifier, such that the sense capability of the sense amplifier can be measured.

In Step S610, the same data is written into the memory cells controlled by at least a pair of first word line on the left side and second word line on the right side corresponding to the sense amplifier.

Figure 7:
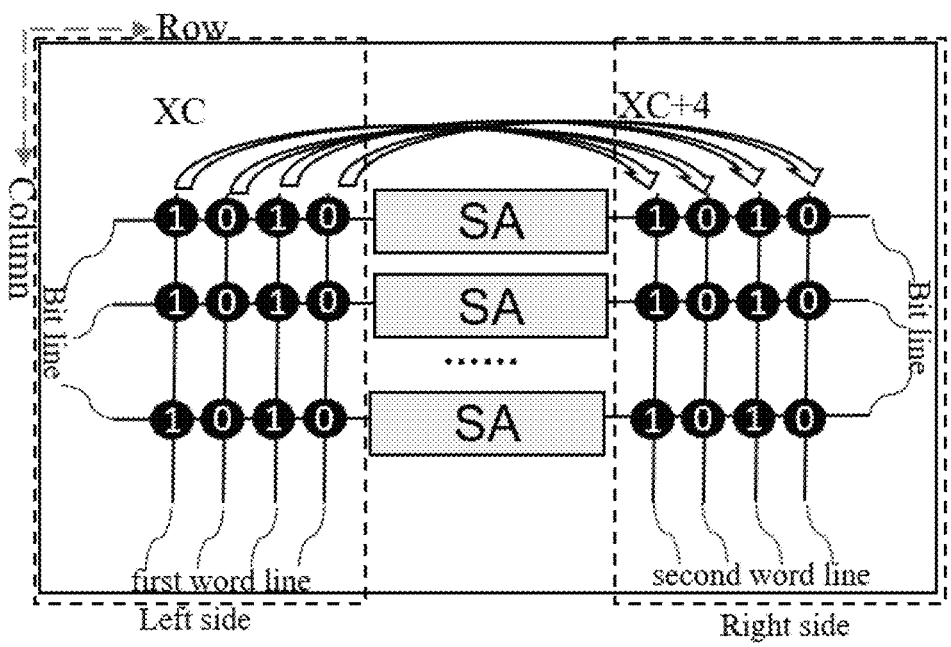
FIG. 7 schematically illustrates schematic structural diagram 1 of a memory array according to an exemplary embodiment of the present disclosure.

Referring to FIG. 7, which illustrates a schematic structural diagram of a memory array. In FIG. 7, a plurality of word lines (WLs) are provided on both sides (i.e. the left side and the right side) of the sense amplifier (SA) corresponding to a bit line (BL) respectively, and if the word line (WL) on the left side of the sense amplifier (SA) is the first word line, the word line (WL) on the right side of the sense amplifier (SA) is the second word line. The first word line and the second word line locate at the left side and the right side of the sense amplifier respectively. In FIG. 7, XC and XC+4 are the serial numbers of a word line. In this exemplary implementation, the number of the word lines (WL) on the left side of the sense amplifier (SA) is four. The number of the word lines (WL) on the right side of the sense amplifier (SA) also is four. The first word line XC corresponds to the second word line XC+4. In practical applications, the numbers of the word lines on the left side and the right side of the sense amplifier (SA) are not limited except they are the same value. The first word line XC can correspond to the second word line XC+5, etc. The correspondence of the first word line and the second word line is not limited by the exemplary implementation of the present disclosure.

In one exemplary implementation of the present disclosure, as shown in FIG. 7, the memory cells in one row on the left side connect one bit line, and the memory cells in one row connect the other bit line. These two bit lines share the same sense amplifier. That is to say, the first word line and the second word line share the same bit line. In this case, when the first word line is flipped, the change of the potential on the bit line (BL) will affect the second word line, such that the read result of the second word line can be affected, and a basis is provided for determining a sense boundary of a sense amplifier.

In practical applications, data 0 or 1 can be written into the memory cells controlled by the first word line and second word line. When data 0 is written into the memory cells controlled by the first word lines and the second word lines, the determined row precharge time boundary value is a boundary value of the sense amplifier sensing signal 0. When data 1 is written into the first word lines and the second word lines, the determined row precharge time boundary value is a boundary value of the sense amplifier sensing signal 1.

In practical applications, the same data is written into the memory cells controlled by the first word line and the second word line, the data can be written into all memory cells of the first word line and the second word line, or the number of memory cells in which the data is written in the memory cells controlled by the first word line or the second word line can be determined according to burst lengths. This is not particularly limited in the exemplary implementation of the present disclosure.

If there are multiple pairs of first word lines and second word lines, one word line (the word line may be the first word line or may be the second word line) on the bit line can be turned on, and the corresponding data is sequentially written into each memory cell controlled by this word line. Then, this word line is turned off, the next word line is turned on, and the data is sequentially written into each memory cell on the next word line until all word lines on the same bit line (BL) are sequentially turned on and the data is written into each memory cell thereon. That is to say, the data can be written into all memory cells controlled by the word lines on the same bit line BL one by one.

It is also possible to write the data into all memory cells controlled by the word lines on the next bit line in the memory array in the above manner until the data is written into all memory cells controlled by the word lines in the memory array, and a result as shown in FIG. 7 is obtained. In FIG. 7, the data written between the memory cells controlled by the multiple pairs of first word lines and second word lines are not completely the same, but the data in the memory cells controlled by each pair of first word line and second word line is the same.

In step S620 and step S630, the first word line is activated and the bit lines corresponding to the first word line are precharged, and the data the memory cells controlled by in the second word line is read after the preset row precharge time.

Figure 8:
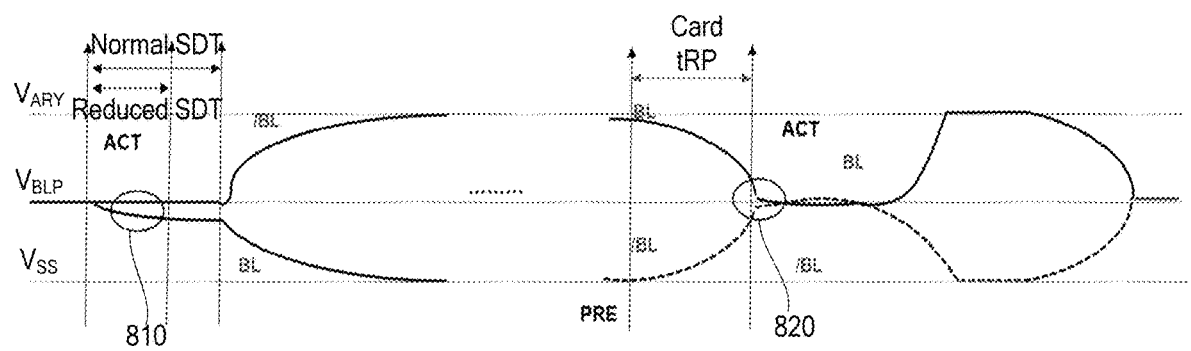
FIG. 8 schematically illustrates a situation of potential change of a sense amplifier in the process of reading data 0 according to an exemplary embodiment of the present disclosure.
Figure 9:
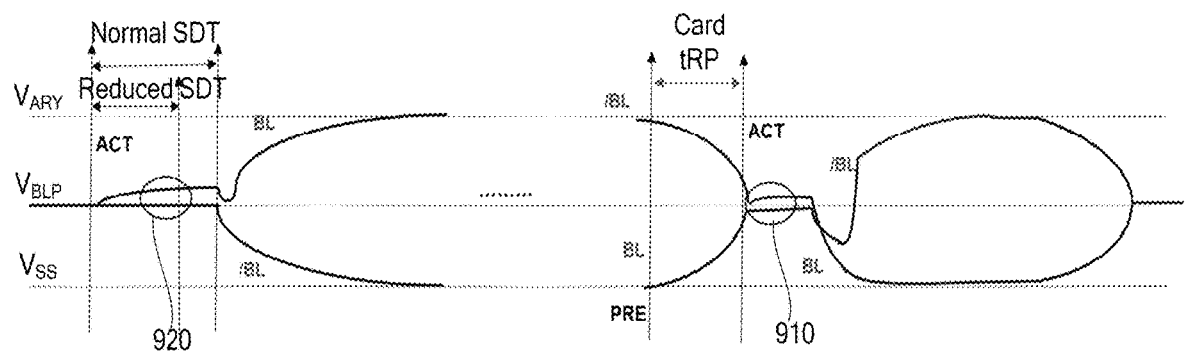
FIG. 9 schematically illustrates a situation of potential change of a sense amplifier in the process of reading data 1 according to an exemplary embodiment of the present disclosure.

In the exemplary implementation of the present disclosure, for the first word line, only actions corresponding to activation ACT and precharge PRE are performed, and no read and write actions are performed. Referring to FIG. 8 and FIG. 9, in the precharge process, the potential on the bit line BL and the potential on the complementary bit line /BL will be reversed, and the reversed potentials will affect the reading of the memory cells controlled by the second word line. That is to say, the signal read on the memory cells controlled by the second word line may be in error after the preset row precharge time tRP.

By taking the situation where data 0 is written into the memory cells controlled by both the first word line and the second word line in FIG. 8 as an example, after the first word line is activated, in the precharge process, the potential on the bit line BL will rise, while the potential on the complementary bit line /BL will drop, such that the potential on the bit line BL is higher than the potential on the complementary bit line /BL. When the second word line is read after the preset row precharge time tRP, if the read data is still 0, it indicates that the sensing of the sense amplifier is correct; and if the read data is 1, it indicates that the sensing of the sense amplifier is wrong. On this basis, the boundary value of the sense amplifier sensing signal 0, namely the corresponding row precharge time boundary value, can be determined, and the capability of the sense amplifier sensing 0 can be estimated on the basis of the boundary value.

By taking the situation where data 1 is written into the memory cells controlled by both the first word line and the second word line in FIG. 9 as an example, after the first word line is activated, in the precharge process, the potential on line BL will drop, while the potential on the complementary bit line /BL will rise, such that the potential on the bit line BL is lower than the potential on the complementary bit line /BL. When the second word line is read after the preset row precharge time tRP, if the read data is still 1, it indicates that the sensing of the sense amplifier is correct; and if the read data is 0, it indicates that the sensing of the sense amplifier is wrong. On this basis, the boundary value of the sense amplifier sensing signal 1, namely the corresponding row precharge time boundary value, can be determined, and the capability of the sense amplifier sensing 1 can be estimated on the basis of the boundary value.

It should be noted that, in the process of reading the data in the memory cells controlled by the second word line, reading can be started from the first memory cell controlled by the second word line, and the first memory cell may be, for example, a memory cell preset by the system, or may be an artificially designated memory cell. In addition, the adjacent memory cells on the burst lengths on the second word line can also be continuously read. This is not particularly limited in the exemplary implementation of the present disclosure.

In step S640, the corresponding critical row precharge time is determined as the row precharge time boundary value when the sense amplifier does not correctly read the data in the memory cells controlled by the second word line.

In one exemplary implementation of the present disclosure, the sense boundary value of the sense amplifier can be determined by changing the row precharge time tRP, and the corresponding critical row precharge time is determined as the row precharge time boundary value when the written data is not correctly read in the memory cells controlled by the second word line.

In practical applications, to obtain the row precharge time tRP more accurately, the critical row precharge time can be determined through multiple pairs of first word lines on the left side and second word lines on the right side of the same sense amplifier.

The next first word line is activated when there are multiple pairs of first word lines and second word lines and the sense amplifier correctly reads the data in the memory cells controlled by the second word line, and the preset row precharge time, namely Card tRP is changed until the sense amplifier cannot correctly read the data on the memory cells controlled by the second word line, then the corresponding critical row precharge time is determined as the row precharge time boundary value.

The next first word line is activated when there are multiple pairs of first word lines and second word lines and the sense amplifier does not correctly read the data in the memory cells controlled by the second word line, and the preset row precharge time, namely Card tRP is changed until the sense amplifier correctly reads the data on the second word line, then the corresponding previous preset row precharge time is determined as the row precharge time boundary value.

Figure 10:
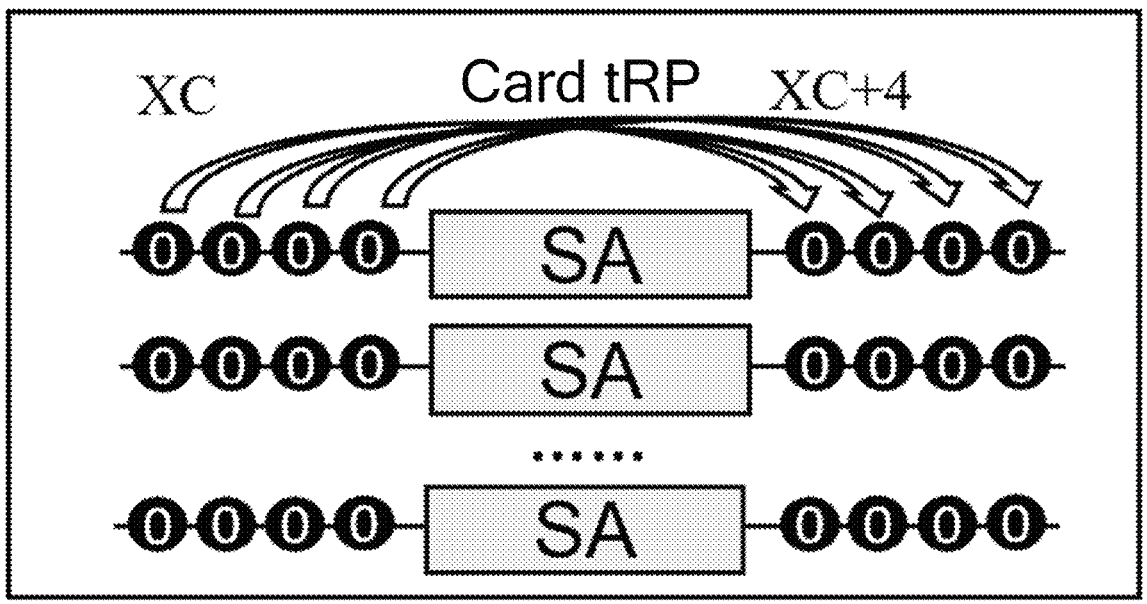
FIG. 10 schematically illustrates schematic structural diagram 2 of a memory array according to an exemplary embodiment of the present disclosure.
Figure 11:
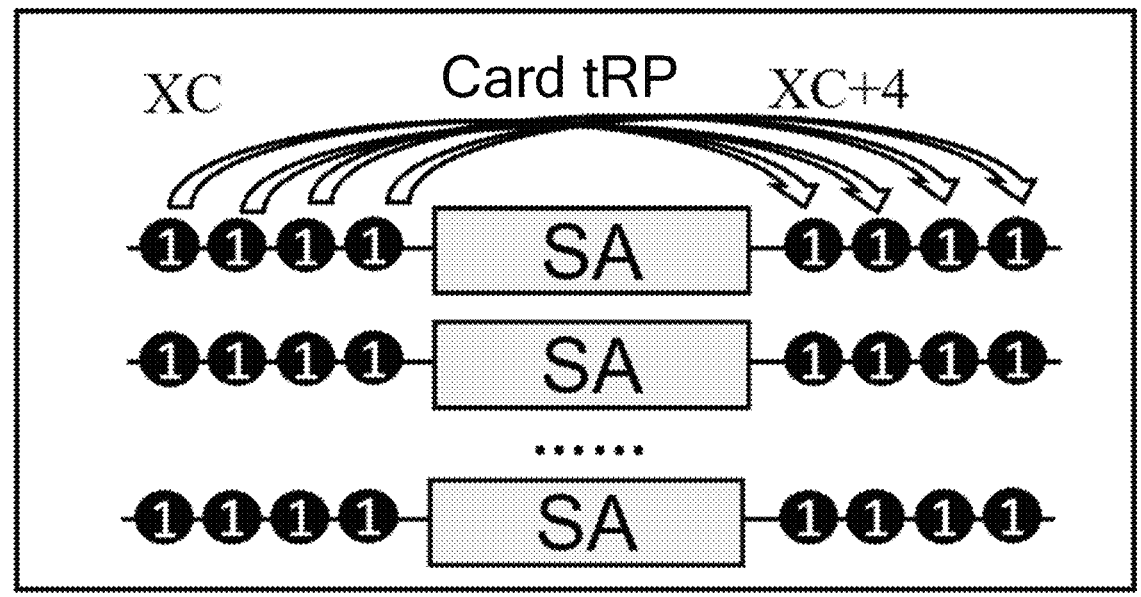
FIG. 11 schematically illustrates schematic structural diagram 3 of a memory array according to an exemplary embodiment of the present disclosure.

It should be noted that the data written into the memory cells controlled by the multiple pairs of first word lines and second word lines for determining the same row precharge time boundary value is the same. For example, as shown in FIG. 10, the data written into the memory cells controlled by the multiple pairs of first word lines and second word lines is 0 for determining the boundary value of the sense amplifier sensing signal 0, where the first word line XC corresponds to the second word line XC+4. In FIG. 11, the data written into the memory cells controlled by the multiple pairs of first word lines and second word lines is 1 for determining the boundary value of the sense amplifier sensing signal 1.

In the process of actually determining the critical row precharge time, its size will be affected by a sensing delay time (SDT). The less the SDT, the shorter the charging sharing time. As shown in FIG. 8 and FIG. 9, compared with normal SDT, the potential difference between the bit line BL and the complementary bit line /BL becomes smaller after the SDT is reduced (as shown in region 810), thereby facilitating the creation of critical boundary conditions.

In the exemplary implementation of the present disclosure, after the first word line is activated, reducing the SDT facilitates the determination of the row precharge time boundary value. In practical applications, the specific size of the reduced SDT can be determined according to actual situations, for example, the reduction of the normal SDT is between 5/1 and 1/2. The degree of SDT reduction is not limited by the exemplary implementation of the present disclosure.

For the multiple pairs of first word lines and second word lines on the same bit line, when the boundary value of the sense amplifier sensing signal 0 is determined, the degree of SDT reduction is the same; and when the boundary value of the sense amplifier sensing signal 1 is determined, the degree of SDT reduction is also the same. Under the same SDT, the determined critical row precharge time is more accurate.

According to the above method, referring to FIG. 10, in the process of determining the boundary value of the sense amplifier sensing signal 0, the data in the memory cells controlled by the multiple pairs of first word lines and second word lines can be set as 0, and after activation, precharge, and reading of data in the memory cells controlled by the second word line are performed on a pair of first word line and second word line, the same process can be performed on the next pair of first word line and second word line, and by parity of reasoning, the same process is also performed on other pairs of first word lines and second word lines until the boundary value of the sense amplifier sensing signal 0 is determined. The execution sequence of the multiple pairs of first word lines and second word lines is not limited by the exemplary implementation of the present disclosure.

Referring to FIG. 11, in the process of determining the boundary value of the sense amplifier sensing signal 1, the data in the memory cells controlled by the multiple pairs of first word lines and second word lines can be set as 1, and after activation, precharge, and reading of data in the memory cells controlled by the second word line are performed on a pair of first word line and second word line, the same process can be performed on the next pair of first word line and second word line, and by parity of reasoning, the same process is also performed on other pairs of first word lines and second word lines until the boundary value of the sense amplifier sensing signal 1 is determined. The execution sequence of the multiple pairs of first word lines and second word lines is likewise not limited herein.

In practical applications, the sense capability of the sense amplifier can be measured according to the row precharge time boundary value. Under the same SDT, if the row precharge time boundary value is less, it indicates that the sense capability of the sense amplifier is stronger. By taking sensing data 0 as an example, if the row precharge time boundary value is less, it indicates that the difference between the potential on the bit line BL and the potential on the complementary bit line /BL in a sense region 820 in FIG. 8 is greater, which means that the sense amplifier is more fault-tolerant and more reliable.

In practical applications, different sense amplifiers have different determined row precharge time boundary values. In the exemplary implementation of the present disclosure, for conventional sense amplifiers, the determined row precharge time boundary value is any value between 5 and 20 ns.

In the exemplary implementation of the present disclosure, the voltage applied to the first word line can also be reduced in the process of activating the first word line, to make the degree of turning on the first word line relatively small, such that the degree of charge sharing can be reduced to further create worse conditions, the difference between the potential on the bit line BL and the potential on the complementary bit line /BL after precharge is greater, the occurrence of a critical situation on the second word line is facilitated, and the row precharge time boundary value is determined.

It should be noted that, to improve the comparability of the determined row precharge time boundary value, the voltage applied to the first word lines in each pair of first word line and second word line is consistent.

In conclusion, in the exemplary implementation of the present disclosure, the same data is written into the memory cells controlled by at least a pair of first word line on the left side and second word line on the right side corresponding to the sense amplifier, after the first word line is activated and precharged, the difference between the potential on the bit line BL and the potential on the complementary bit line /BL can be changed in the process of reading the data in the memory cells controlled by the second word line in combination with Card tRP. When the voltage difference reaches one critical value, the situation where the data is wrongly read occurs. In such a situation, the determined critical row precharge time is the row precharge time boundary value for measuring the sense capability of the sense amplifier.

It should be noted that although the steps of the method in the present disclosure are described in the accompanying drawings in a particular sequence, it is not required or implied that the steps must be performed in that particular sequence or that all of the steps shown must be performed to achieve the desired results. Additionally or alternatively, some steps may be omitted, a plurality of steps may be combined into a single step for execution, and/or a single step may be divided into a plurality of steps for execution.

Figure 12:
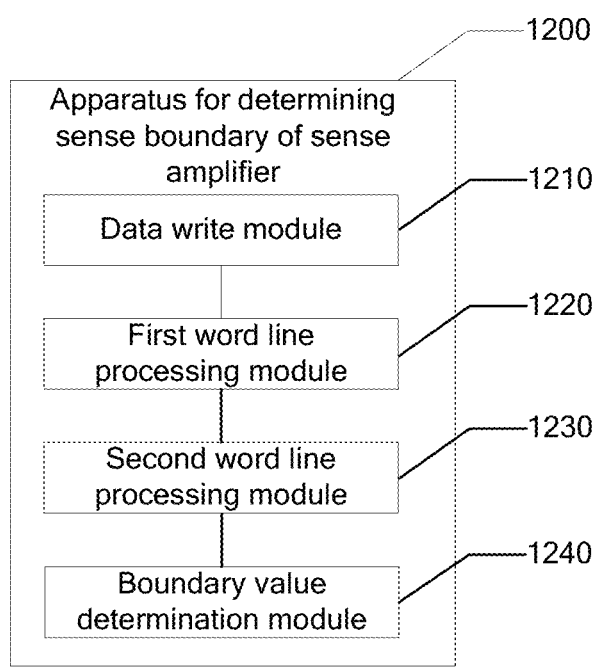
FIG. 12 schematically illustrates a block diagram of an apparatus for determining a sense boundary of a sense amplifier according to an exemplary embodiment of the present disclosure.

In this exemplary implementation, an apparatus for determining a sense boundary of a sense amplifier is also provided. Referring to FIG. 12, the apparatus 1200 for determining a sense boundary of a sense amplifier may include a data write module 1210, a first word line processing module 1220, a second word line processing module 1230, and a boundary value determination module 1240.

The data write module 1210 is configured to write the same data into the memory cells controlled by at least a pair of first word line on the left side and second word line on the right side corresponding to the sense amplifier.

The first word line processing module 1220 is configured to activate the first word line and precharge the bit lines corresponding to the first word line.

The second word line processing module 1230 is configured to read the data in the memory cells controlled by the second word line after a preset row precharge time.

The boundary value determination module 1240 is configured to determine a corresponding critical row precharge time as a row precharge time boundary value when the sense amplifier does not correctly read the data in the memory cells controlled by the second word line.

In one exemplary implementation of the present disclosure, the boundary value determination module 1240 is configured to activate a next first word line when there are multiple pairs of first word lines and second word lines and the sense amplifier correctly reads the data in the memory cells controlled by the second word line, change the preset row precharge time until the sense amplifier cannot correctly read the data on the memory cells controlled by the second word line, and determine the corresponding critical row precharge time as the row precharge time boundary value.

In one exemplary implementation of the present disclosure, the boundary value determination module 1240 is configured to activate a next first word line when there are multiple pairs of first word lines and second word lines and the sense amplifier does not correctly read the data in the memory cells controlled by the second word line, change the preset row precharge time until the sense amplifier correctly reads the data on the memory cells controlled by the second word line, and determine the corresponding previous preset row precharge time as the row precharge time boundary value.

In one exemplary implementation of the present disclosure, the same data is written into the memory cells controlled by the multiple pairs of first word lines and second word lines.

In one exemplary implementation of the present disclosure, when data 0 is written into the memory cells controlled by the first word lines and the second word lines, the determined row precharge time boundary value is a boundary value of the sense amplifier sensing signal 0.

In one exemplary implementation of the present disclosure, when data 1 is written into the memory cells controlled by the first word lines and the second word lines, the determined row precharge time boundary value is a boundary value of the sense amplifier sensing signal 1.

In one exemplary implementation of the present disclosure, the first word line processing module 1220 is also configured to reduce a sense delay time after the first word line is activated, to shorten a charge sharing time.

In one exemplary implementation of the present disclosure, the determined row precharge time boundary value is any value between 5 and 20 ns.

In one exemplary implementation of the present disclosure, the first word line processing module 1220 is also configured to reduce a voltage applied to the first word line in the process of activating the first word line.

In one exemplary implementation of the present disclosure, the first word line and the second word line share a bit line corresponding to the sense amplifier.

The specific details of a virtual module of each apparatus for determining a sense boundary of a sense amplifier are described in detail in the corresponding method for determining a sense boundary of a sense amplifier. Therefore, details are not described again herein.

Although several modules or units of the apparatus for determining a sense boundary of a sense amplifier are mentioned in the above description, such division of modules or units is not mandatory. In fact, according to the implementations of the present disclosure, the features and functions of two or more modules or units described above may be embodied in one module or unit. Correspondingly, the features and functions of a module or unit described above may be further divided into a plurality of modules or units to be embodied.

An exemplary embodiment of the present disclosure further provides an electronic device that can be configured to implement the foregoing method.

Those skilled in the art can understand that aspects of the present disclosure may be implemented as systems, methods, or program products. Therefore, the aspects of the present disclosure may be specifically implemented in a form of a fully hardware implementation, a fully software implementation (including firmware, microcode, or the like), or a combination of hardware and software, which may be collectively referred to as a "circuit", "module", or "system".

An electronic device 1300 according to the exemplary implementation of the present disclosure is described below with reference to FIG. 13. The electronic device 1300 shown in FIG. 13 is only an example, which should not be construed as any limitation on the function and application scope of the embodiment of the present disclosure.

Figure 13:
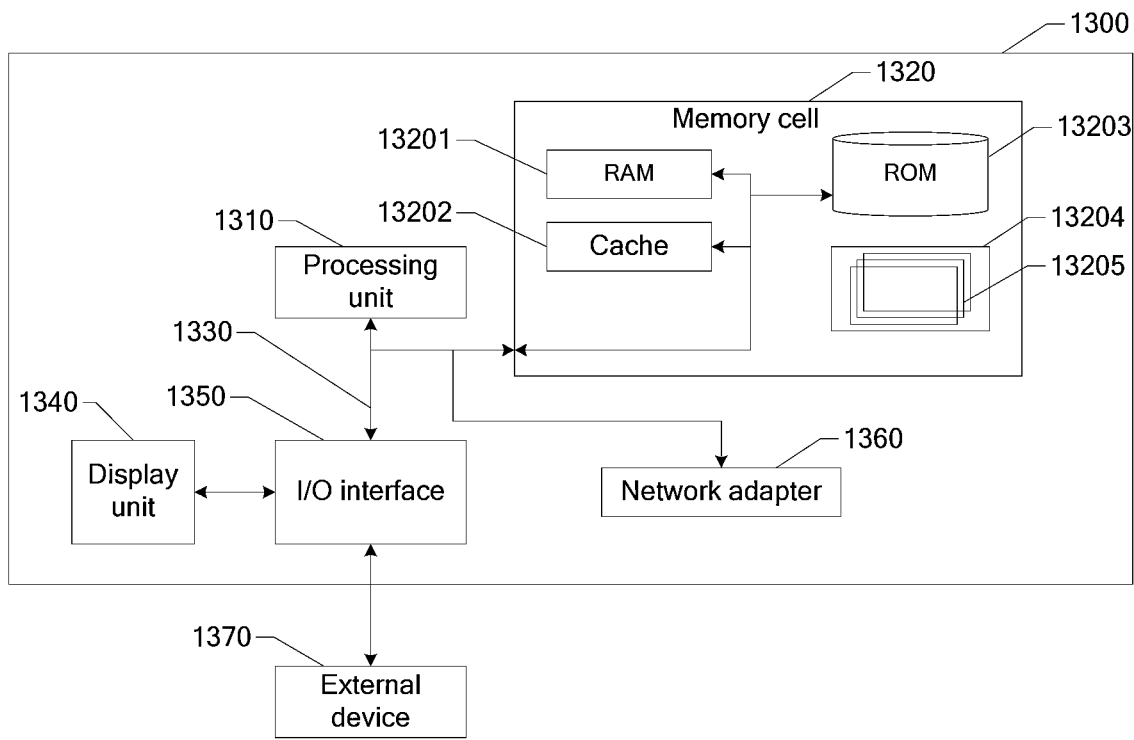
FIG. 13 schematically illustrates a schematic module diagram of an electronic device according to an exemplary embodiment of the present disclosure.

As shown in FIG. 13, the electronic device 1300 is represented in the form of a general purpose computer. Components of the electronic device 1300 may include, but are not limited to, at least one processing unit 1310, at least one memory cell 1320, a bus 1330 connecting different system components (including the memory cell 1320 and the processing unit 1310), and a display unit 1340.

The memory cell 1320 stores program code which can be executed by the processing unit 1310, such that the processing unit 1310 performs the steps according to the exemplary implementations of the present disclosure described in the "exemplary methods" of the specification. For example, as shown in FIG. 6, the processing unit 1310 may perform: step S610, write the same data into the memory cells controlled by at least a pair of first word line on the left side and second word line on the right side corresponding to the sense amplifier; step S620, activate the first word line and precharge the capacitors of the the memory cells controlled by the first word line; step S630, read the data in the memory cells controlled by the second word line after a preset row precharge time; and step S640, determine a corresponding critical row precharge time as a row precharge time boundary value when the sense amplifier does not correctly read the data in the memory cells controlled by the second word line.

The memory cell 1320 may include a readable medium in a form of a volatile memory cell, for example, a RAM 13201 and/or a cache memory cell 13202, and may further include a ROM 13203.

The memory cell 1320 may alternatively include a program/utility 13204 including a set of (at least one) program modules 13205, and the program modules 13205 each include, but are not limited to: an operating system, one or more applications, other program modules and program data. Each of these examples or some combination thereof may include an implementation of a network environment.

The bus 1330 may be one or more of several types of bus structures, including a memory cell bus or a memory cell controller, a peripheral bus, a graphics acceleration port, a processing unit, or a local area bus using any one of a plurality of bus structures.

The electronic device 1300 may further communicate with one or more external devices 1370 (for example, a keyboard, a pointing device, or a Bluetooth device), with one or more devices that enable a user to interact with the electronic device 1300, and/or with any device that enables the electronic device 1300 to communicate with one or more other computing devices (for example, a router or a modem). Such communication may be performed through an input/output (I/O) interface 1350. The electronic device 1300 may further communicate with one or more networks (for example, a LAN, a WAN, and/or a public network such as the Internet) through a network adapter 1360. As shown in the figure, the network adapter 1360 communicates with other modules of the electronic device 1300 through the bus 1330. It should be understood that although not shown in the figure, other hardware and/or software modules may be used in combination with the electronic device 1300, including but not limited to: microcode, a device driver, a redundant processing unit, an external disk drive array, an RAID system, a tape driver, and a data backup storage system.

Figure 14:
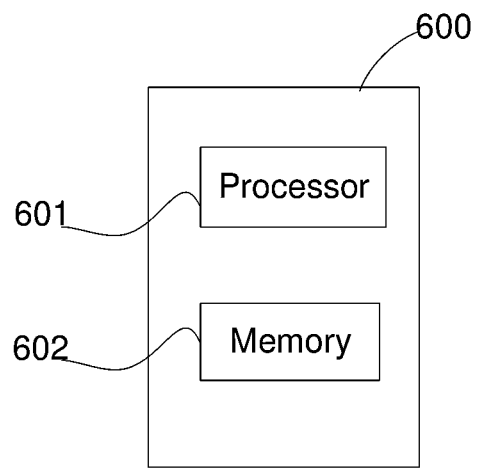
FIG. 14 is a block diagram of an apparatus for determining a sense boundary of a sense amplifier according to an exemplary embodiment.

An exemplary embodiment of the present disclosure provides an apparatus for determining a sense boundary of a sense amplifier. Referring to FIG. 14, the apparatus for determining a sense boundary of a sense amplifier 600 may be provided as a terminal device. The apparatus for determining a sense boundary of a sense amplifier 600 may include a processor 601, and one or more processors may be set as required. The apparatus for determining a sense boundary of a sense amplifier 600 may further include a memory 602 configured to store an executable instruction, such as an application program, of the processor 601. One or more memories may be set as required. The memory may store one or more application programs. The processor 601 is configured to execute the instruction to perform the foregoing method.

Through the foregoing description of the implementations, persons skilled in the art may easily understand that the exemplary implementations described herein may be implemented by software, or may be implemented by software in combination with necessary hardware. Therefore, the technical solutions according to the implementations of the present disclosure may be implemented in a form of a software product. The software product may be stored in a non-volatile storage medium (which may be a compact disk read-only memory (CD-ROM), a USB flash drive, a removable hard disk, or the like), and includes a plurality of instructions to cause a computing device (which may be a personal computer, a server, a terminal apparatus, a network device, or the like) to perform the method according to the implementations of the present disclosure.

An exemplary embodiment of the present disclosure further provides a computer-readable storage medium. Referring to FIG. 14, for example, the computer-readable storage medium may be the memory 602 including instructions. The foregoing instructions may be executed by the processor 601 of the apparatus for determining a sense boundary of a sense amplifier 600 to complete the foregoing method. In some possible implementations, various aspects of the present disclosure may alternatively be implemented in a form of a program product, which includes program code. When the program product runs on a terminal device, the program code is used to enable the terminal device to perform the steps according to various exemplary implementations of the present disclosure described in the foregoing "exemplary methods" of this specification.

A program product for implementing the method according to the embodiments of the present disclosure may be in the form of a portable compact disk read-only memory (CD-ROM) and include program code, and may be run on a terminal device, such as a personal computer. However, the program product of the present disclosure is not limited hereto. In the present disclosure, a readable storage medium may be any tangible medium that contains or stores a program, and the program may be used by or in combination with an instruction execution system, apparatus, or device.

The program product may be any combination of one or more readable media. The readable media each may be a readable signal medium or a readable storage medium. The readable storage medium, may be, for example, but not limited to, electrical, magnetic, optical, electromagnetic, infrared, or semiconductor systems, apparatuses, or devices, or any combination thereof. Examples (non-exhaustive) of the readable storage medium include an electrical connection with one or more conducting wires, a portable computer disk, a hard disk, a random access memory (RAM), a read-only memory (ROM), an erasable programmable ROM (an EPROM or a flash memory), an optical fiber, a portable CD-ROM, an optical storage device, a magnetic storage device, or any suitable combination thereof.

The computer-readable signal medium may include a data signal propagated in a baseband or as a part of a carrier, and readable program code is carried therein. The propagated data signal may be in various forms, including but not limited to an electromagnetic signal, an optical signal, or any suitable combination thereof. The readable signal medium may alternatively be any readable medium other than the readable storage medium. The readable medium may send, propagate, or transmit a program to be used by or in combination with the instruction execution system, apparatus, or device.

The program code contained on the readable medium may be transmitted using any suitable medium, including but not limited to: a wireless medium, a wired medium, an optical fiber, an RF, or any suitable combination thereof.

The present disclosure is described with reference to the flowcharts and/or block diagrams of the method, the apparatus (device), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, such that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct the computer or any other programmable data processing device to work in a specific manner, such that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, such that a series of operations and steps are performed on the computer or the another programmable device, thereby generating computer-implemented processing. Therefore, the instructions executed on the computer or the another programmable device provide steps for implementing a function specified in one or more processes in the flowcharts and/or in one or more blocks in the block diagrams.

Program code for executing the operations in the present disclosure may be compiled by using any combination of one or more programming languages. The programming languages include object oriented programming languages, such as Java and C++, and conventional procedural programming languages, such as C or similar programming languages. The program code can be executed fully on a user computing device, executed partially on a user device, executed as an independent software package, executed partially on a user computing device and partially on a remote computing device, or executed fully on a remote computing device or a server. In a circumstance in which a remote computer is involved, the remote computer may be connected to a user computer via any type of network, including a LAN or a WAN, or may be connected to an external computer (for example, connected via the Internet by using an Internet service provider).

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

In the method for determining a sense boundary of a sense amplifier provided by the embodiment of the present disclosure, the same data is written into a pair of first word line on the left side and second word line on the right side corresponding to the sense amplifier, when the second word line is read after the first word line is activated and precharged, the sense amplifier needs to be crossed, and in the process of crossing the sense amplifier, a potential of a complementary bit line /BL on the second word line will be reversed due to an interlocking effect between a bit line BL and the complementary bit line /BL, such that the potential of the complementary bit line /BL on the second word line will be deviated from an equilibrium value, and wrong reading will occur when the data in the second word line is read. By presetting the row precharge time, the situation of wrong reading can be quantified, such that the situation where the data is not correctly read can be determined as the critical row precharge time, which is used as the row precharge time boundary value for determining and measuring the sense boundary of the sense amplifier, such that the sense capability of the sense amplifier can be measured.

What is claimed is:

1. A method for determining a sense boundary of a sense amplifier, comprising:
   writing a same data into memory cells controlled by at least a pair of first word line on the left side and second word line on the right side corresponding to the sense amplifier;
   activating the first word line and precharging bit lines corresponding to the first word line;
   reading the data in the memory cells controlled by the second word line after a preset row precharge time; and
   determining a corresponding critical row precharge time as a row precharge time boundary value when the sense amplifier does not correctly read the data in the memory cells controlled by the second word line.

2. The method according to claim 1, further comprising:
   activating a next first word line when there are multiple pairs of first word lines and second word lines and the sense amplifier correctly reads the data in the memory cells controlled by the second word line, changing the preset row precharge time until the sense amplifier cannot correctly read the data on the memory cells controlled by the second word line, and determining the corresponding critical row precharge time as the row precharge time boundary value.

3. The method according to claim 1, further comprising:
   activating a next first word line when there are multiple pairs of first word lines and second word lines and the sense amplifier does not correctly read the data in the memory cells controlled by the second word line, changing the preset row precharge time until the sense amplifier correctly reads the data on the memory cells controlled by the second word line, and determining a corresponding previous preset row precharge time as the row precharge time boundary value.

4. The method according to claim 2, wherein a same data is written into the memory cells controlled by the multiple pairs of first word lines and second word lines.

5. The method according to claim 4, wherein when data 0 is written into the memory cells controlled by the first word lines and the second word lines, the row precharge time boundary value determined is a boundary value of the sense amplifier sensing signal 0.

6. The method according to claim 4, wherein when data 1 is written into the memory cells controlled by the first word lines and the second word lines, the row precharge time boundary value determined is a boundary value of the sense amplifier sensing signal 1.

7. The method according to claim 1, further comprising:
reducing a sense delay time after the first word line is activated, to shorten a charge sharing time.

8. The method according to claim 1, wherein the row precharge time boundary value is any value between 5 and 20 ns.

9. The method according to claim 1, further comprising:
reducing a voltage applied to the first word line in a process of activating the first word line.

10. A computer-readable storage medium, on which a computer program is stored, wherein the computer program is executed by a processor to implement the method for determining a sense boundary of a sense amplifier according to claim 1.

11. An apparatus for determining a sense boundary of a sense amplifier, comprising:
one or more processors; and
a storage apparatus, configured to store one or more programs, wherein the one or more programs, when executed by the one or more processors, cause the one or more processors to execute operations of:
writing a same data into the memory cells controlled by at least a pair of first word line on the left side and second word line on the right side corresponding to both sides of the sense amplifier;
activating the first word line and precharging bit lines corresponding to the first word line;
reading the data in the memory cells controlled by the corresponding second word line after a preset row precharge time; and
determining a corresponding critical row precharge time as a row precharge time boundary value when the sense amplifier does not correctly read the data in the memory cells controlled by the second word line.

12. The apparatus according to claim 11, wherein the one or more programs cause the one or more processors to execute operations of activating a next first word line when there are multiple pairs of first word lines and second word lines and the sense amplifier correctly reads the data in the memory cells controlled by the second word line, changing the preset row precharge time until the sense amplifier cannot correctly read the data on the memory cells controlled by the second word line, and determining the corresponding critical row precharge time as the row precharge time boundary value.

13. The apparatus according to claim 11, wherein the one or more programs cause the one or more processors to execute operations of activating a next first word line when there are multiple pairs of first word lines and second word lines and the sense amplifier does not correctly read the data in the memory cells controlled by the second word line, changing the preset row precharge time until the sense amplifier correctly reads the data on the memory cells controlled by the second word line, and determining a corresponding previous preset row precharge time as the row precharge time boundary value.

14. The apparatus according to claim 12, wherein a same data is written into the memory cells controlled by the multiple pairs of first word lines and second word lines.

15. The apparatus according to claim 14, wherein when data 0 is written into the memory cells controlled by the first word lines and the second word lines, the row precharge time boundary value determined is a boundary value of the sense amplifier sensing signal 0; and
when data 1 is written into the memory cells controlled by the first word lines and the second word lines, the row precharge time boundary value determined is a boundary value of the sense amplifier sensing signal 1.

16. The apparatus according to claim 11, wherein the one or more programs cause the one or more processors to execute operations of reducing a sense delay time after the first word line is activated, to shorten a charge sharing time.

17. The apparatus according to claim 11, wherein the row precharge time boundary value is any value between 5 and 20 ns.

18. The apparatus according to claim 11, wherein the one or more programs cause the one or more processors to execute operations of reducing a voltage applied to the first word line in a process of activating the first word line.

* * * * *